(12) United States Patent
Jiang et al.

(10) Patent No.: US 6,288,885 B1
(45) Date of Patent: Sep. 11, 2001

(54) METHOD AND APPARATUS FOR ELECTROSTATIC DISCHARGE PROTECTION FOR PRINTED CIRCUIT BOARDS

(75) Inventors: Tongbi Jiang, Boise; David Y. Kao, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,521

(22) Filed: Sep. 2, 1999

(51) Int. Cl.$^7$ ...................................................... H02H 3/22
(52) U.S. Cl. ............................................. 361/111; 361/56
(58) Field of Search .............................. 361/111, 56, 54, 361/748, 760, 95; 257/355–363; 327/306, 309–311

(56) References Cited

U.S. PATENT DOCUMENTS

| | | | |
|---|---|---|---|
| 5,287,241 | * | 2/1994 | Puar ......................................... 361/56 |
| 5,369,552 | * | 11/1994 | Barnes et al. ......................... 361/816 |
| 5,784,242 | * | 7/1998 | Watt ....................................... 361/111 |
| 5,959,821 | * | 9/1999 | Voogel ................................. 361/111 |
| 5,970,321 | * | 10/1999 | Hively .................................. 438/123 |
| 5,991,135 | * | 11/1999 | Saleh ...................................... 361/56 |
| 6,060,752 | * | 5/2000 | Williams .............................. 257/355 |

* cited by examiner

*Primary Examiner*—Kim Huynh
(74) *Attorney, Agent, or Firm*—Hugh R. Kress; Winstead Sechrest & Minick

(57) ABSTRACT

An in its various embodiments is a method and apparatus for electrostatic discharge protection. In one aspect of the present invention, an integrated circuit device capable of providing electrostatic discharge protection for use on a printed circuit board containing a possible source of electrostatic discharge and operational circuitry is provided. The integrated circuit device includes an input coupled to the possible source of electrostatic discharge, an output coupled to the operational circuitry on the printed circuit board, a capacitance structure between the input and the output, and a switch in series with the capacitance structure. The integrated circuit also provides, a method for protecting a printed circuit board from electrostatic discharge by switching the discharge to a capacitance structure for subsequent dissipation into the printed circuit board.

27 Claims, 3 Drawing Sheets

METHOD AND APPARATUS FOR ELECTROSTATIC DISCHARGE PROTECTION FOR PRINTED CIRCUIT BOARDS

FIELD OF THE INVENTION

This invention relates generally to electronic circuits and more particularly, to electrostatic discharge ("ESD") protection circuits.

BACKGROUND OF THE INVENTION

It is well recognized in the electronics industry that electrostatic discharge ("ESD") can severely damage integrated circuit devices. While electrical discharges as low as 30 volts can damage semiconductor integrated circuit ("IC") devices, electrostatic discharges of several hundred volts can occur during the routine handling of printed circuit boards to which IC devices are attached.

In recognition of the potential for ESD voltages damaging sensitive semiconductor devices, many ICs are provided with on-chip ESD protection circuitry adapted to prevent ESD voltages from damaging other on-chip circuitry. Typically, such circuitry is provided for each individual pin of the integrated circuit. Those of ordinary skill in the art will be familiar with a great many different types and implementations of on-chip ESD protection circuitry. A common approach is to provide circuitry responsive to voltages above a certain threshold to divert such voltages directly to a ground terminal, thereby avoiding other circuitry on the IC. An example of this is proposed in U.S. Pat. No. 4,692,781.

Another common method of avoiding ESD damage to semiconductor devices is to add external (i.e., off-chip) ESD protection circuitry to the printed circuit boards upon which one or more ICs are disposed. Such external ESD protection circuitry is designed to divert any electrostatic discharge away from operational circuitry and toward a ground terminal. Such external ESD protection circuitry is typically made up of discrete components attached to the printed circuit board.

There are perceive disadvantages to the aforementioned methodology for avoiding ESD damage to ICs mounted on printed circuit boards. First, the discrete components that make up the ESD protection circuitry occupy space on the printed circuit board, thereby reducing the amount of space available for operational circuitry. Second, designing an ESD protection circuit for a printed circuit board increases the cost of designing that printed circuit board. Finally, such external ESD protection circuitry may not provide any ESD protection when the printed circuit board is not attached to a solid ground line. For example, a printed circuit board is not attached to a ground line when it is being shipped from the manufacturer to a customer, and is therefore vulnerable during shipping to ESD-related damage.

The present invention is directed to overcoming, or at least reducing the effects of, one or more of the foregoing perceived disadvantages.

SUMMARY OF THE INVENTION

The invention, in its various embodiments is a method and apparatus for electrostatic discharge protection. In accordance with one aspect of the present invention, an ESD protection device in the form of an integrated circuit and capable of providing electrostatic discharge protection to other operational circuitry on a printed circuit is provided.

The ESD protection device includes an input coupled to a possible source of electrostatic discharge, for example, one or more of the conductive traces interconnecting the other operational components on the board. Further, the ESD protection device includes an output coupled to the operational circuitry on the printed circuit board, a capacitance structure between the input and the output, and a switch in series with the capacitance structure.

In accordance with another aspect of the invention, a method for protecting a printed circuit board from electrostatic discharge is provided. The method comprises switching the discharge to a capacitance structure for subsequent dissipation into the printed circuit board.

BRIEF DESCRIPTION OF THE DRAWINGS

Various features and aspects of the present invention will perhaps be best appreciated with reference to detailed descriptions of specific embodiments of the invention, when read in conjunction with the accompanying drawings, wherein.

DETAILED DESCRIPTION OF A SPECIFIC EMBODIMENT OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 1:
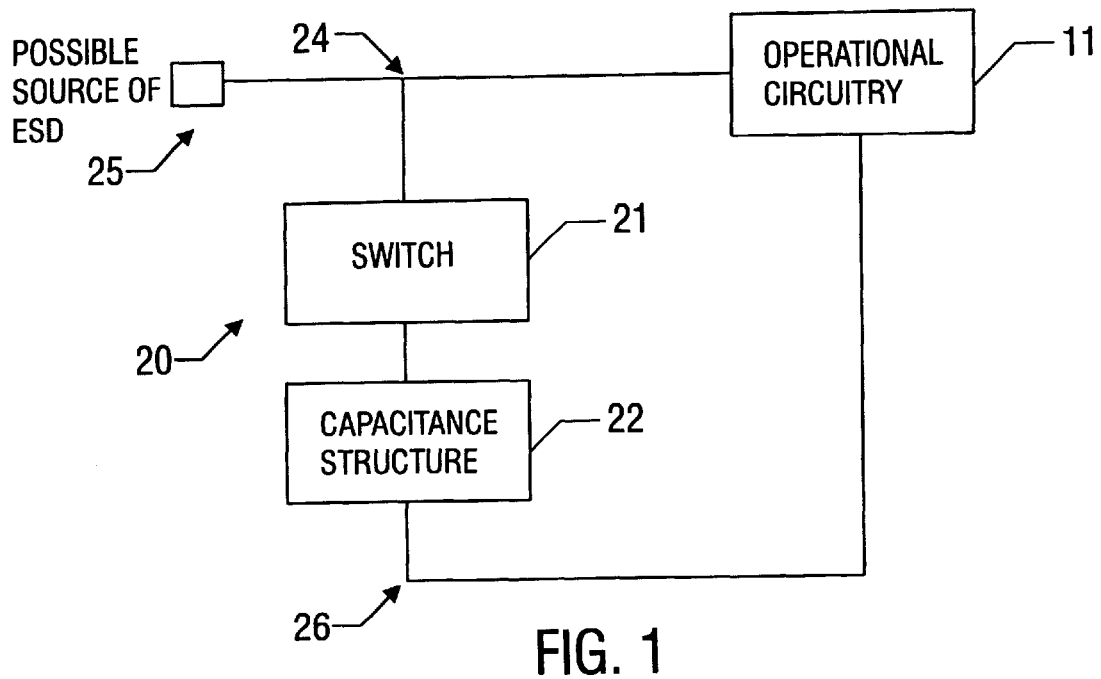
FIG. 1 is a block diagram illustrating an ESD protection circuit constructed and operated in accordance with an embodiment of the present invention.

FIG. 1 illustrates one embodiment of the invention, an ESD protection device 20. In the presently disclosed embodiment of the invention, ESD protection device 20 is embodied in an integrated circuit having at least one input and at least one output. In one embodiment, ESD protection device 20 comprises a switch 21 and a capacitance structure 22. An input 24 into ESD protection device 20, which will be connected to a possible source of ESD 25, is connected to the switch 21. Those of ordinary skill in the art will recognize that essentially any conductive element of a printed circuit board can represent a "possible source of ESD," in that any conductor may be exposed to external ESD, for example, from a human who is handling the board.

Capacitance structure 22 is connected to an output 26 of ESD protection circuit 20. As noted above, in one embodiment of the invention, switch 21 and capacitance structure 22 are embodied in a single integrated circuit. Those of ordinary skill in the art will appreciate that the term "integrated circuit," as used herein, refers to a circuit in which the circuit elements such as diodes, transistors, capacitors and the like are fabricated and interconnected on a common substrate of semiconductor material, as opposed to a non-integrated circuit in which the elements comprising the circuit are fabricated from discrete devices attached to a printed circuit board. In one embodiment, the ESD protection circuit 20 is in the form of an integrated circuit that can be attached to a printed circuit board.

Switch 21 allows conduction through ESD protection device 20 only when a threshold voltage across device 20 is reached. When the voltage is below this threshold, switch 21 will isolate ESD protection device 20 from the operational circuitry 11 on the printed circuit board. In the present disclosure, the term "operational circuitry" shall be used to refer to the circuitry that enables the circuit board to perform whatever function it is intended to perform. That is, "operational circuitry" as used herein is intended to refer to the one or more integrated circuits and other electronic devices—other than ESD protection device itself—that are disposed upon the printed circuit board, along with the various interconnecting conductive traces which enable these devices to cooperate with one another. For example, a printed circuit board may have a plurality of individual semiconductor memory ICs mounted thereon as "operational circuitry." Those of ordinary skill in the art having the benefit of the present disclosure will appreciate how an ESD device 20 in accordance with the presently disclosed embodiment of the invention may be advantageously utilized to protect those memory devices. Although a memory module is one example of operational circuitry with which the present invention may be advantageously practiced, those of ordinary skill in the art will be familiar with a variety of other classes of operational circuitry to which the teachings of the present disclosure may be beneficially applied.

The threshold voltage of switch 21 must be low enough to divert damaging ESD, but high enough to minimize the effect of ESD protection device 20 on operational circuitry 11. The precise value of the threshold voltage is otherwise immaterial to the practice of the invention and may vary from implementation to implementation.

Capacitance structure 22 in the presently disclosed embodiment of the invention stores charge from any ESD which enters the input 24 of the ESD protection circuit 20, and subsequently dissipates this charge into output 26. The capacitance structure 22 preferably has sufficient storage capacity to accumulate enough of the charge from an electrostatic discharge so that any charge not stored by the capacitance structure will not damage operational circuitry 11. Conventional ESD protection circuits, which simply shunt electrostatic discharge to ground, provide no ESD protection for a printed circuit board unless the conventional ESD protection circuit is electrically connected to ground. On the other hand, the present invention, which provides ESD protection by collecting the ESD in capacitance structure 22 and subsequently dissipating it to output 26, provides ESD protection regardless of whether the printed circuit board is connected to ground. In other words, conventional ESD protection circuits discharge the charge from ESD to ground, while the invention in its various embodiments stores the charge from ESD and then shares that charge with the operational circuitry 11 in a non-destructive manner.

Another difference between conventional ESD protection circuits and the invention in its various embodiments is that switches in conventional ESD protection circuits are exposed to the entire voltage difference between the source of the electrostatic discharge and ground. This exposure tends to shorten the life of the switch. The voltage drop across the switch 21 in the present invention is likely to be much lower, due to the presence of capacitance structure 22, thus increasing the switch's operational life.

Figure 2:
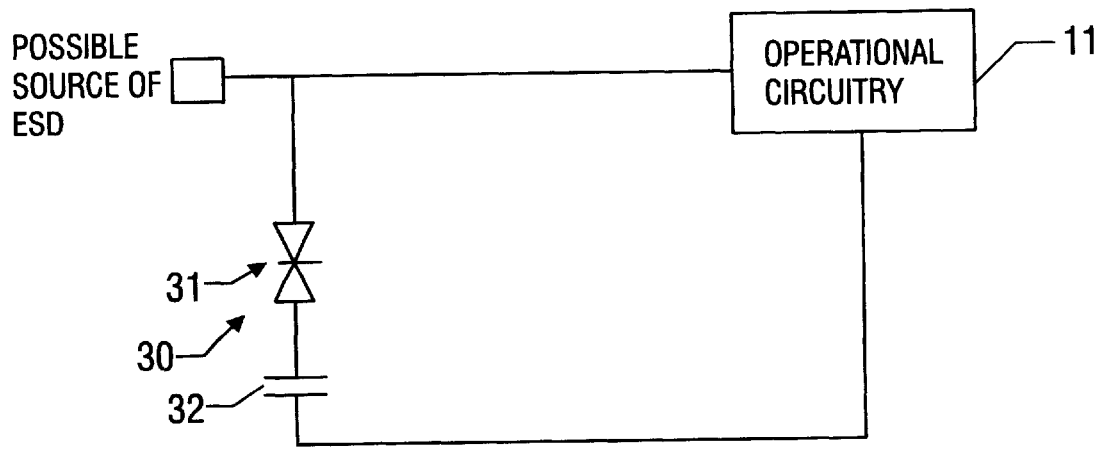
FIG. 2 is a combined block diagram/schematic diagram illustrating one particular embodiment of the ESD protection circuit in FIG. 1 in which the switch and the capacitance structure of FIG. 1 comprise a pair of oppositely oriented diodes and a single capacitor, respectively.

FIG. 2 illustrates one particular embodiment 30 of the invention in which switch 21 of FIG. 2 comprises oppositely oriented diodes 31 and capacitance structure 22 of FIG. 2 comprises a single capacitor 32. The threshold voltage, which, when exceeded, will allow current to flow into the ESD protection circuit 30, will be the breakdown voltage of whichever of the two diodes 31 is reverse biased. As will be recognized by those in the art, the particular one of the two oppositely oriented diodes 31 that will be reverse-biased will depend on whether the voltage of the electrostatic discharge is positive or negative. Once the threshold voltage is exceeded, the electrostatic discharge will accumulate in the capacitor 32.

Figure 2A:
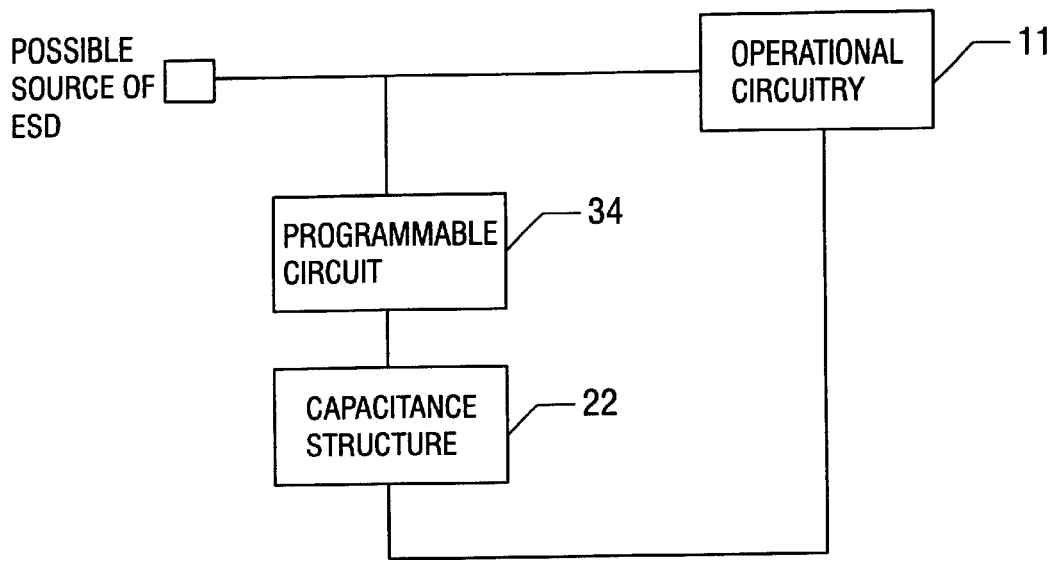
FIG. 2A is a block diagram illustrating one particular embodiment of the ESD protection circuit in FIG. 1 in which the switch comprises a programmable circuit.

In an alternative embodiment of switch 21, shown in FIG. 2A, a programmable circuit 34 allows the threshold voltage to be selectively adjusted. With a programmable switch, a lower threshold voltage could be selected when the printed circuit board is not in use, so as to provide maximum ESD protection, while a higher threshold voltage could be selected when the printed circuit board is in use, so as to minimize interference with the operational circuitry 11.

Returning to FIG. 2, in one particular embodiment, the capacitance structure 22 is a capacitor with a storage capacity of at least 0.5 $\mu$F. This storage capacity should protect a printed circuit board from the electrostatic discharge which could result from the handling of the board by human beings. For example, a human body usually has 20 pF to 250 pF capacitance, carrying static charge up to 10kV. Thus the worst case magnitude of an electrostatic discharge from a human body should be $$Q = CV$$
$$= 250 \times 10^{-12} \ F \cdot 10,000 \ V$$
$$= 2.5 \times 10^{-6} \ C \qquad ,$$

where

Q is the magnitude (in Coulombs) of the electrostatic discharge,

C is the storage capacity of the capacitor (in Farads), and

V is the voltage (in Volt) associated with the static charge.

If ESD protection circuit 30 has a storage capacity of 0.5 $\mu$F, it would be able to accumulate enough of the discharge so that the operational circuitry 11 would only be exposed to a voltage of $$V = Q/C$$
$$= 2.5 \times 10^{-6} \ C / 0.5 \times 10^{-6} \ F$$
$$= 5.0 \ V$$

Such a voltage is low enough as to not damage the operational circuitry 11. Using modern metal-oxide semiconductor ("MOS") technology, it is easy and inexpensive to fabricate the capacitance structure of this particular embodiment.

Figure 3:
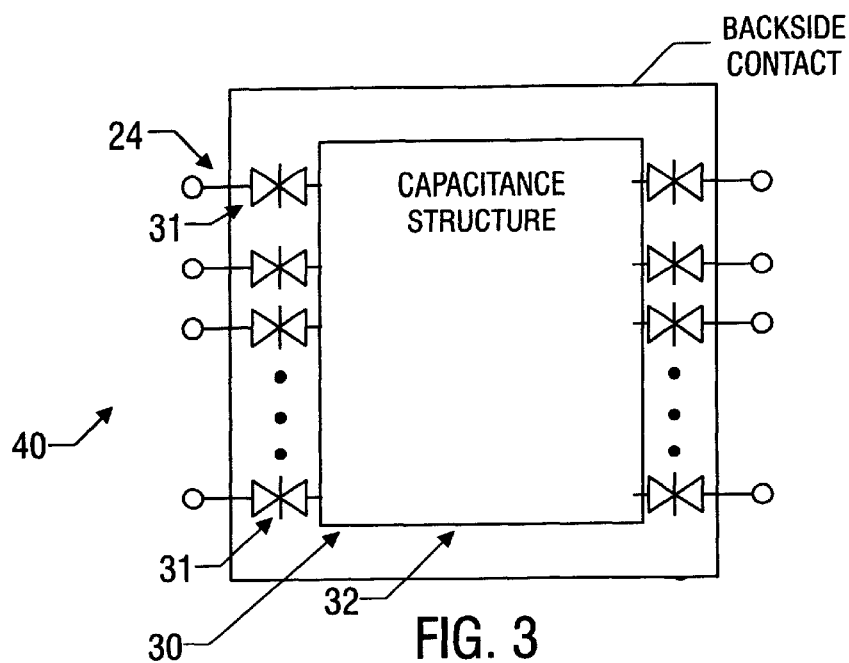
FIG. 3 is a schematic diagram of one embodiment of a die containing the ESD protection circuit of FIG. 3.

ESD protection device 30 of FIG. 2 may be fabricated as an integrated circuit as shown in FIG. 3, which is a schematic diagram of a possible layout of a silicon die 40 containing ESD protection device 30. In this embodiment, switch 31 and capacitance structure 32 are fabricated as an integrated circuit on a single silicon die 40. This die could contain several switches 31, with each switch 31 connected to its own input line 24. All of the switches 31 on die 40 are coupled to a single capacitance structure 32 in this particular embodiment, although those of ordinary skill in the art will appreciate that this is not necessary for the purposes of the present invention. Output 26 (not shown in FIG. 3) of ESD protection circuit 30 in the presently disclosed embodiment is on the backside of the die 40. Note, however, the invention is not limited to circuit 30 in die 40, and in alternative embodiments alternative circuits 20 may be fabricated in die 40 in accordance with the invention.

Figure 4:
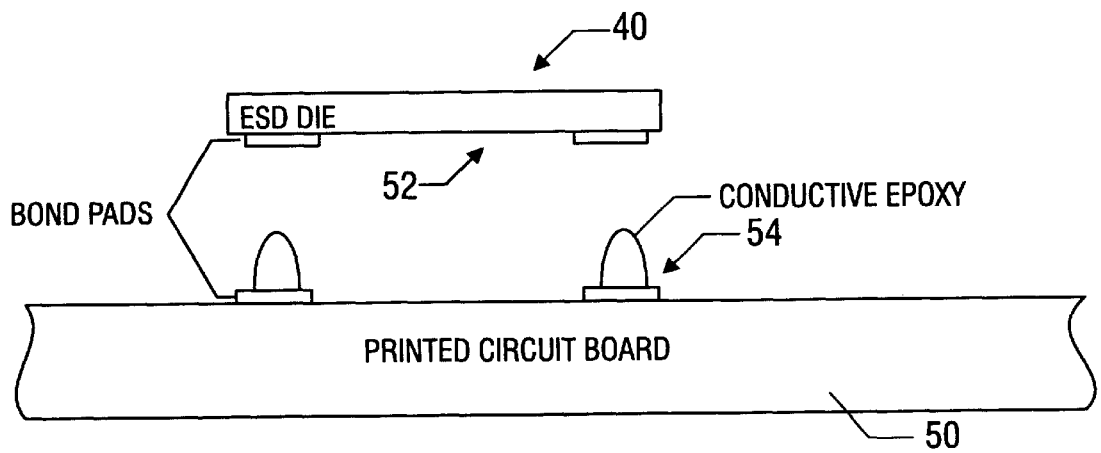
FIG. 4 is a cross section diagram illustrating the ESD protection circuit of FIG. 1 on the die of FIG. 3, and that die is attached to a printed circuit board using flip chip technology.

FIG. 4 shows one method by which die 40 in FIG. 3 may be attached to a printed circuit board 50. Die 40 is considered attached to printed circuit board 50 when it is electrically connected to the circuit board 50, and physically connected if necessary. Note that in alternative embodiments of the invention, components of ESD protection device may be integrated into the printed circuit board, i.e. components of the ESD protection circuit could be fabricated as part of the printed circuit board. For this reason the term attached does not necessarily require physical attachment. In the embodiment of FIG. 4, ESD protection circuit 30 is on a silicon die 40 which must be both electrically and physically attached to the printed circuit board 50.

One method of attachment in the embodiment of FIG. 4 is so-called flip chip technology. In flip chip technology, silicon die 40 is attached with its active area 52 facing the printed circuit board 50. In the embodiment illustrated in FIG. 4, the silicon die 40 is both physically and electrically connected to the printed circuit board 50 by means of a conductive epoxy 54. Although a conductive epoxy 54 is used in this embodiment of the invention, other materials such as thermoplastic material, solder bumps, or anisotropic films may be used. Furthermore, the attachment method is not limited to flip chip technology. Any packaging technology such as chip on board ("COB") or surface mount technology ("SMT") could be used to attach the die 40 containing the ESD protection circuit 30 to the printed circuit board 50.

Figure 5:
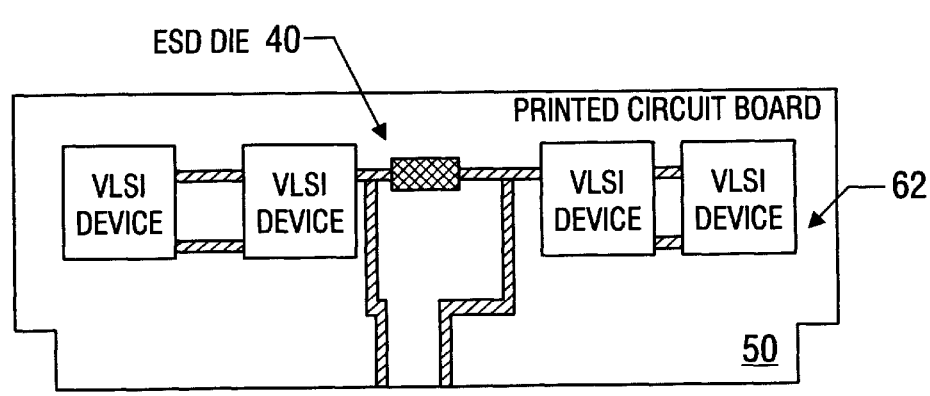
FIG. 5 is a block diagram illustrating one possible method of incorporating the die of FIG. 3 containing the ESD protection device into the circuitry on a printed circuit board.

FIG. 5 illustrates how integrated circuit 40 may be placed on a printed circuit board 50. Using flip chip technology to attach the die 40 to the printed circuit board 50 advantageously minimizes the printed circuit board 50 area taken up by the ESD protection circuit 20. Input lines 24 (not shown in FIG. 5), each of which corresponds to one of the diode switches 31 shown in FIG. 3, may be connected to possible sources 25 of electrostatic discharge. The ESD protection circuit 20 would thus provide ESD protection for any operational circuitry 11 on the printed circuit board 50 which is susceptible to ESD damage, such as the VLSI devices 62 shown in FIG. 5.

Figure 6:
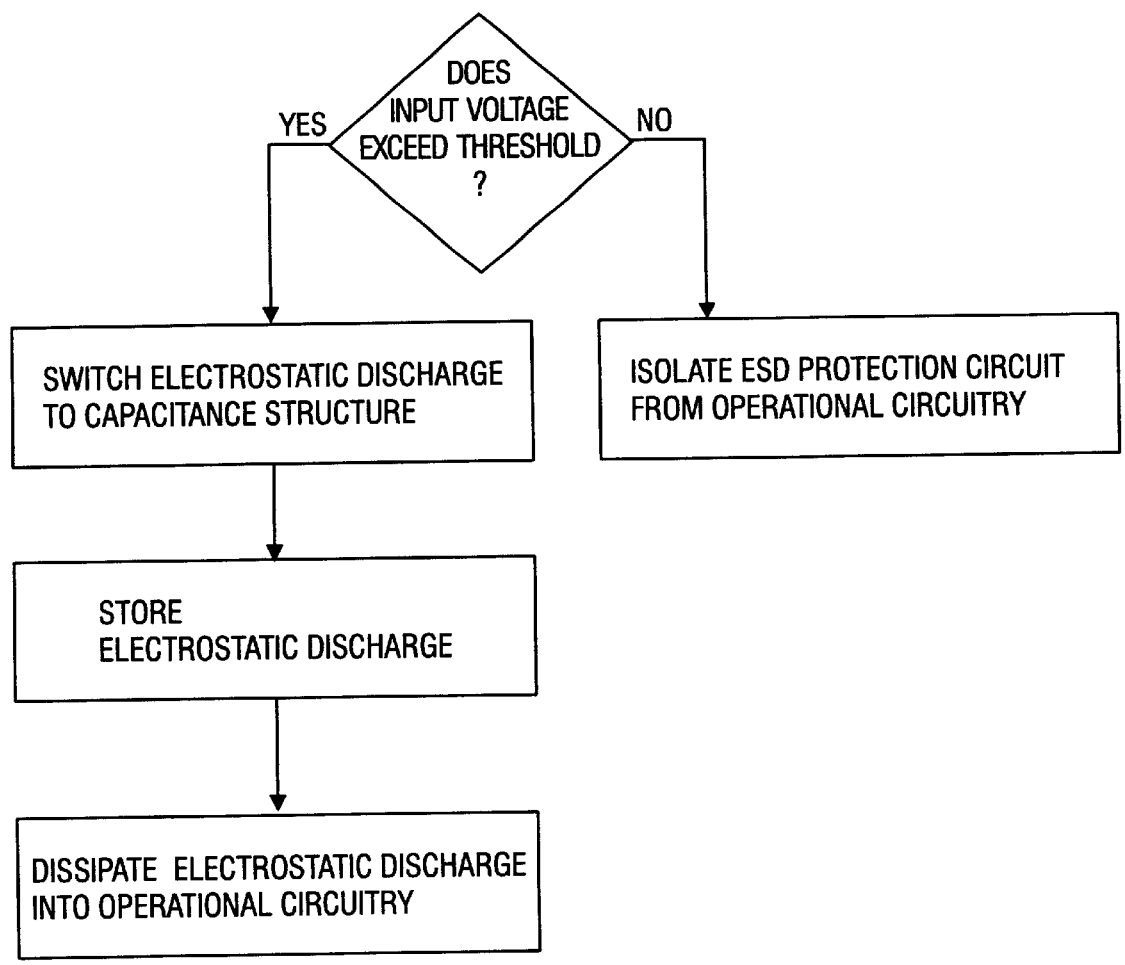
FIG. 6 is a flow chart illustrating one embodiment of the method for protecting operational circuitry from ESD damage.

FIG. 6 illustrates another embodiment of the invention, namely a method for protecting operational circuitry from damage caused by electrostatic discharge. In this embodiment, current will only flow to a capacitance structure when the voltage at an input node exceeds a threshold voltage. This threshold voltage is chosen so that it will not be reached during the normal functioning of the operational circuitry; the threshold voltage will only be reached when an electrostatic discharge event occurs. When such an event occurs, the electrostatic discharge will be directed toward a capacitance structure, in which the charge from the electrostatic discharge will be stored and subsequently dissipated. When the voltage at the input node is below the threshold voltage, the capacitance structure is isolated from the operational circuitry. In this embodiment of the invention, when the charge from ESD is dissipated, the charge is being shared with operational circuitry. The sharing of ESD charge with operational circuitry differentiates this embodiment of the invention from conventional ESD protection circuits in which the charge from ESD is discharged to ground.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

From the foregoing detailed description of a specific embodiment of the invention, it should be apparent that a method and apparatus for providing protection to a printed circuit board has been disclosed. Although a specific embodiment of the invention has been described herein in detail, this has been done solely for the purposes of illustrating various aspects of the invention, and is not intended to be limiting with respect to the scope of the invention. It is contemplated that various substitutions, alternations, and/ or modifications, including but not limited to those design variations which may have been specifically mentioned herein, may be made to the disclosed embodiment without departing from the spirit and scope of the invention, as defined in the claims associated with this disclosure.

What is claimed is:

1. An integrated circuit capable of providing electrostatic discharge protection for use on a printed circuit board including a possible source of electrostatic discharge and operational circuitry, the integrated circuit comprising:

an input to be electrically connected to the possible source of electrostatic discharge, an output electrically connected to the operational circuitry on said printed circuit board, a capacitance structure between said input and said output, for dissipating electrostatic discharge to the operational circuit and a switch in series with the capacitance structure.

2. The integrated circuit of claim 1, wherein the possible source of electrostatic discharge includes the electrostatic discharge that results from the handling of the printed circuit board by a human being.

3. The integrated circuit of claim 1 wherein the switch includes two oppositely oriented diodes.

4. The integrated circuit of claim 3 wherein the two oppositely oriented diodes comprise zener diodes.

5. The integrated circuit of claim 1 wherein the switch comprises a programmable circuit allowing selection of the threshold voltage.

6. The integrated circuit of claim 1 wherein the integrated circuit is attached to the printed circuit board using a technology selected from the group of flip-chip technology, chip-on-board technology, and surface mount technology.

7. The integrated circuit of claim 1 wherein the capacitance structure has a storage capacity of at least 0.5 $\mu$F.

8. An integrated circuit capable of providing electrostatic discharge protection for use on a printed circuit board including a possible source of electrostatic discharge and operational circuitry, the integrated circuit comprising:
   an input coupled to the possible source of electrostatic discharge,
   an output coupled to the operational circuitry on said printed circuit board,
   a capacitance structure integrated into the printed circuit board between said input and output; for dissipating electrostatic discharge to the operational circuit and
   means for switching an electrostatic discharge from the possible source to the capacitance structure, said means for switching being surface mounted on the printed circuit board in series with the capacitance structure.

9. The integrated circuit of claim 8, wherein the means for switching is selected from the group comprising two oppositely oriented diodes and a programmable circuit.

10. An integrated circuit capable of providing electrostatic discharge protection for use on a printed circuit board including a possible source of electrostatic discharge and operational circuitry, the integrated circuit comprising:
    an input coupled to the possible source of electrostatic discharge,
    an output coupled to the operational circuitry,
    means for collecting and dissipating electrostatic discharge coupled between said input and said output, and
    means for coupling and decoupling the means for collecting and dissipating electrostatic discharge to the operational circuitry.

11. The integrated circuit of claim 10 wherein the means for coupling includes two oppositely oriented diodes.

12. The integrated circuit of claim 11 wherein the two oppositely oriented diodes comprise zener diodes.

13. The integrated circuit of claim 10 wherein the means for coupling comprises a programmable circuit allowing selection of the threshold voltage.

14. The integrated circuit of claim 10 wherein the integrated circuit is attached to the printed circuit board using a technology selected from the group of flip-chip technology, chip-on-board technology, and surface mount technology.

15. A method for protecting a printed circuit board from electrostatic discharge comprising switching the discharge to a capacitance structure for subsequent dissipation into operational circuitry on a printed circuit board.

16. The method of claim 15 wherein switching the discharge to a capacitance structure includes switching the discharge using two oppositely oriented diodes.

17. The method of claim 16 wherein switching the discharge using two oppositely oriented diodes includes switching the discharge using two oppositely oriented zener diodes.

18. The method of claim 15 wherein switching the discharge to a capacitance structure comprises switching the discharge to capacitance structure using a programmable circuit allowing selection of the threshold voltage.

19. The method of claim 15, further comprising:
    storing the electrostatic discharge in the capacitance structure; and
    dissipating the stored electrostatic discharge into the operational circuitry.

20. A printed circuit board comprising:
    a possible source of electrostatic discharge;
    operational circuitry; and
    an electrostatic discharge protection circuitry, including:
        an input coupled to the possible source of electrostatic discharge;
        an output coupled to the operational circuitry;
        a capacitance structure between the input and the output; for dissipating electrostatic discharge to the operational circuit and
        a switch in series with the capacitance structure.

21. The printed circuit board of claim 20 wherein the electrostatic discharge protection circuitry is an integrated circuit attached to said printed circuit board.

22. The printed circuit board of claim 21 wherein the electrostatic discharge protection circuitry is attached to the printed circuit board using a technology selected from the group of: flip-chip technology, chip-on-board technology, and surface mount technology.

23. The printed circuit board of claim 20 wherein portions of the electrostatic discharge protection circuitry are built into said printed circuit board.

24. A method for protecting a printed circuit board from electrostatic discharge, comprising:
    attaching an integrated circuit to the printed circuit board, the integrated circuit comprising a switch and a capacitance structure;
    switching an electrostatic discharge to the capacitance structure:
    storing the electrostatic discharge in the capacitance structure; and
    dissipating the stored electrostatic discharge into the operational circuitry.

25. The method of claim 24 wherein switching the discharge to a capacitance structure includes switching the discharge using two oppositely oriented diodes.

26. The method of claim 25 wherein switching the discharge using two oppositely oriented diodes includes switching the discharge using two oppositely oriented zener diodes.

27. The method of claim 24 wherein switching the discharge to a capacitance structure comprises switching the discharge to capacitance structure using a programmable circuit allowing selection of the threshold voltage.

* * * * *